(12) United States Patent
Olofsson

(10) Patent No.: US 7,538,569 B2
(45) Date of Patent: May 26, 2009

(54) INTEGRATED CIRCUITS WITH PROGRAMMABLE WELL BIASING

(75) Inventor: Andreas D. Olofsson, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/906,386

(22) Filed: Oct. 2, 2007

(65) Prior Publication Data

US 2009/0085578 A1   Apr. 2, 2009

(51) Int. Cl.
*G01R 31/02* (2006.01)
(52) U.S. Cl. .................. 324/763; 327/534; 702/107
(58) Field of Classification Search ............ 324/763, 324/158.1; 327/524–538; 438/18; 702/85–107
See application file for complete search history.

(56) References Cited

U.S. PATENT DOCUMENTS

| | | | |
|---|---|---|---|
| 4,638,464 A * | 1/1987 | Cranford, Jr. et al. | |
| 5,537,362 A * | 7/1996 | Gill et al. | |
| 5,699,312 A * | 12/1997 | Wong | |
| 5,760,637 A * | 6/1998 | Wong et al. | |
| 5,889,701 A * | 3/1999 | Kang et al. | |
| 6,069,825 A * | 5/2000 | Tang | |
| 7,274,247 B2 * | 9/2007 | Ward et al. | 327/534 |
| 7,453,311 B1 * | 11/2008 | Hart et al. | 327/534 |

OTHER PUBLICATIONS

Narendra et al., "Forward Body Bias for Microprocessors in 130-nm Technology Generation and Beyond", IEEE Journal of Solid-State Circuits, May 2003, pp. 696-701, vol. 38, No. 5.
Choi et al., "Lookup Table-Based Adaptive Body Biasing of Multiple Macros", IEEE Computer Society, Proceedings of the 8th International Symposium on Quality Electronic Design (ISQED '07), 0-7695-2795-7/07, 6 pages, 2007.
Chen et al., "Comparison of Adaptive Body Bias (ABB) and Adaptive Supply Voltage (ASV) for Improving Delay and Leakage Under the Presence of Process Variation", IEEE Transactions on Very Large Scale Integration (VLSI) Systems, Oct. 2003, pp. 888-899, vol. 11, No. 5.

(Continued)

*Primary Examiner*—Ha Tran T Nguyen
*Assistant Examiner*—Arleen M Vazquez
(74) *Attorney, Agent, or Firm*—Wolf, Greenfield & Sacks, P.C.

(57) ABSTRACT

An integrated circuit includes a substrate, a storage device formed in the substrate to hold bias settings, and operational blocks formed in the substrate, each operational block including an operational circuit and a charge pump to provide well bias voltages to the operational circuit in response to one or more of the bias settings. A method for testing an integrated circuit having two or more operational blocks includes: (a) determining a maximum operating speed of each of the blocks at a minimum supply voltage; (b) selecting a block that has a slow operating speed; (c) selecting a well bias to speed up the selected block; (d) selecting a supply voltage to meet a target operating frequency at the selected well bias and measuring power; (e) repeating acts (b)-(d) while the measured power is less than a baseline power; and (f) saving the selected well bias and supply voltage settings for operation of the integrated circuit.

10 Claims, 6 Drawing Sheets

OTHER PUBLICATIONS

Tschanz et al., "Adaptive Circuit Techniques to Minimize Variation Impacts on Microprocessor Performance and Power", IEEE, 2005, 0-7803-8834-8/05, pp. 9-12.

Meijer et al., "Limits to Performance Spread Tuning using Adaptive Voltage and Body Biasing", IEEE, 2005, 0-7803-8834-8/05, pp. 5-8.

Kao et al., "A 175-mV Multiply-Accumulate Unit Using an Adaptive Supply Voltage and Body Bias Architecture", IEEE Journal of Solid-State Circuits, Nov. 2002, pp. 1545-1554, vol. 37, No. 11.

Tschanz et al., "Adaptive Body Bias for Reducing Impacts of Die-to-Die and Within-Die Parameter Variations on Microprocessor Frequency and Leakage", IEEE Journal of Solid-State Circuits, Nov. 2002, pp. 1396-1402, vol. 37, No. 11.

Narendra et al., "Impact of Using Adaptive Body Bias to Compensate Die-to-die $Vt$ Variation on Within-die $Vt$ variation", ISLPED99, San Diego, CA, USA, ACM 1-58113-133-X/99/0008, pp. 229-232, 1999.

Nose et al., "$V_{TH}$-Hopping Scheme to Reduce Subthreshold Leakage for Low-Power Processors", IEEE Journal of Solid-State Circuits, Mar. 2002, pp. 413-419, vol. 37, No. 3.

Duarte et al., "Evaluating Run-Time Techniques for Leakage Power Reduction", IEEE Computer Society, Proceedings of the 15th International Conference on VLSI Design (VLSID'02), 0-7695-1441-3/02, 8 pages, 2002.

Mizuno et al., "An 18-µA Standby Current 1.8-V, 200-MHz Microprocessor with Self-Substrate-Biased Data-Retention Mode", IEEE Journal of Solid-State Circuits, Nov. 1999, pp. 1492-1500, vol. 34, No. 11.

International Search Report and Written Opinion from International Patent Application PCT/US/2008/011066, dated Feb. 11, 2009.*

* cited by examiner

INTEGRATED CIRCUITS WITH PROGRAMMABLE WELL BIASING

FIELD OF THE INVENTION

This invention relates to enhancing the operation of VLSI (very large scale integrated circuits) and, more particularly, to methods and devices for enhancing the operation of VLSI using per-block well bias adjustment and per-chip supply voltage adjustment.

BACKGROUND OF THE INVENTION

For VLSI chips implemented in deep sub-micron process technology (less than 0.25 micrometer), die-to-die and intra-die variations can cause significant degradation in chip performance. In most applications, chips are both power and timing constrained, causing a situation where any deviation from the typical process may lead to a loss in yield. Any transistor that operates near the slow end of the process range causes the frequency of the chip to suffer. Any transistor operates near the fast end of the process range causes the chip power consumption to increase. In a chip with tight power and frequency constraints, this may lead to many chips being discarded. Ideally, the designer wants all transistors in a chip and all chips in a wafer to behave the same and to behave in a typical fashion. The fast end of the range was not previously a problem, since leakage current was not an issue in larger geometries. Now, with leakage current being a significant portion of the on-chip power, any variation in leakage power can cause the chip to fail its power budget.

Supply voltage adjustment has been used to control chip operation. It is known that both power and speed scale with supply voltage. In particular, power increases as the square of the supply voltage. In addition, it is also known that N-well and P-well biasing of the integrated circuit affects leakage current and speed. However in the prior art, power supply adjustment and well biasing adjustment have been done on a per-chip basis. Using this approach, it may be impossible to bring a chip within power and speed constraints.

Accordingly, there is a need for improved methods and devices for enhancing the operation of integrated circuits.

SUMMARY OF THE INVENTION

According to a first aspect of the invention, an integrated circuit comprises a substrate, a storage device formed in the substrate to hold bias settings, and at least first and second operational blocks formed in the substrate, each operational block comprising an operational circuit and a charge pump to provide well biases to the operational circuit in response to one or more of the bias settings.

According to a second aspect of the invention, a method is provided for testing an integrated circuit, the integrated circuit including two or more operational blocks fabricated in a substrate. The method comprises: (a) determining a maximum operating speed of each of the operational blocks at a minimum supply voltage and no well bias; (b) selecting an operational block that has a slower operating speed than at least one other operational block; (c) selecting a well bias to speed up the selected operational block; (d) selecting a supply voltage to meet a target operating frequency at the selected well bias and measuring power with the selected well bias applied to the selected operational block and the selected supply voltage applied to the integrated circuit; (e) repeating acts (b)-(d) while the measured power is less than a baseline power that meets the target operating frequency with no well bias applied to the operational blocks; and (f) saving the selected well bias and supply voltage settings for operation of the integrated circuit. To assist in selecting the well bias and the supply voltage, the integrated circuit and a process for fabrication thereof may be characterized to determine speed as a function of supply voltage and speed as a function of well bias.

According to a third aspect of the invention, a method is provided for operating an integrated circuit. The method comprises fabricating an integrated circuit having two or more operational blocks, each of the operational blocks including an operational circuit and a charge pump, measuring a performance parameter of each of the operational blocks, and adjusting the charge pump in each of the operational blocks when the measured performance parameter for that operational block differs from a set point.

BRIEF DESCRIPTION OF THE DRAWINGS

For a better understanding of the present invention, reference is made to the accompanying drawings, which are incorporated herein by reference in which.

DETAILED DESCRIPTION

Figure 1:
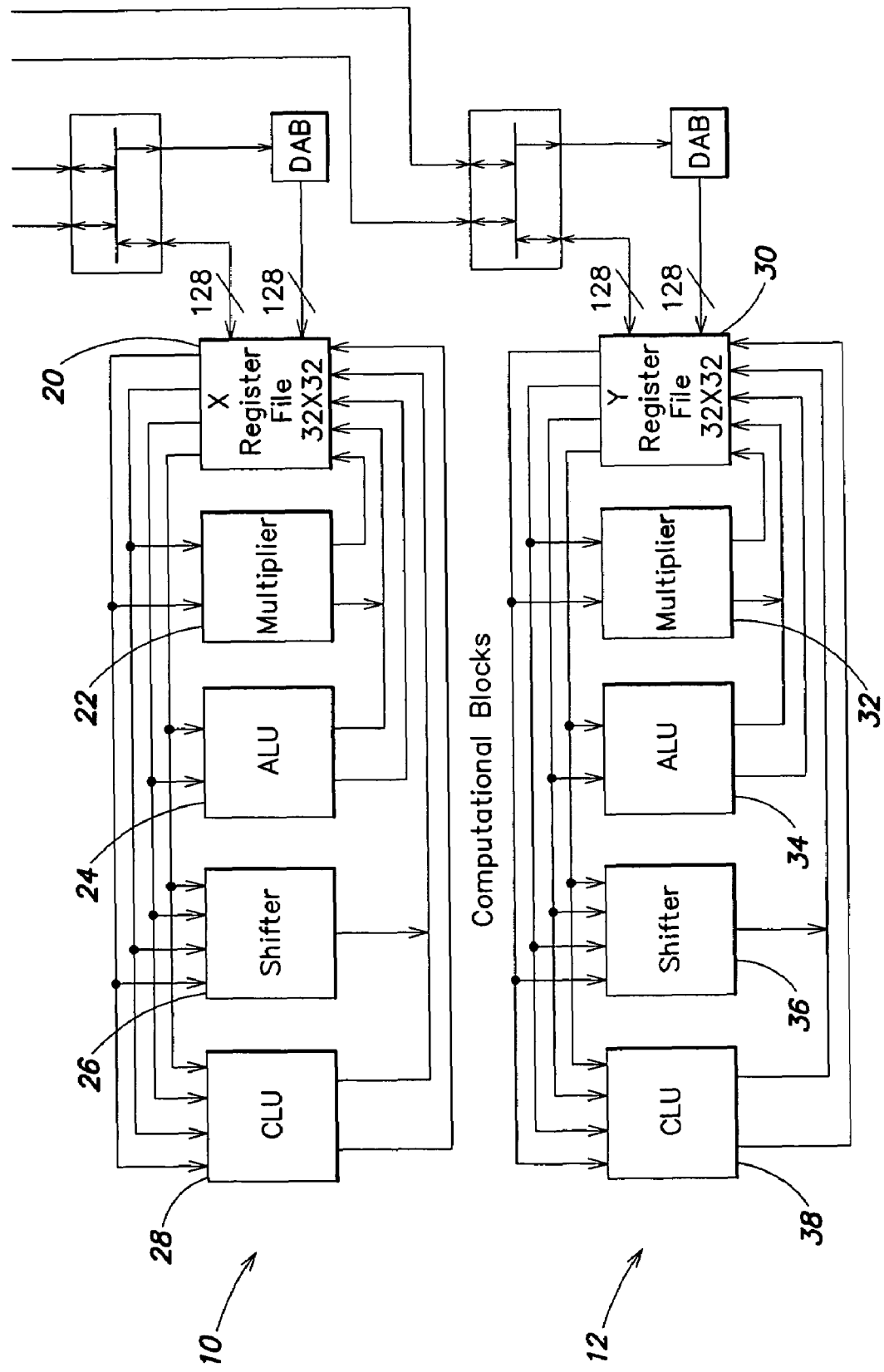
FIG. 1 is a schematic block diagram of an example of a digital signal processor having a plurality of operational blocks formed on a single substrate.

A block diagram of an example of computation blocks of a conventional digital signal processor (DSP) is shown in FIG. 1. The example of FIG. 1 includes an X computation block 10 and a Y computation block 12. The X computation block 10 includes operational blocks such as a register file 20, a multiplier 22, an ALU 24, a shifter 26 and a communication logic unit (CLU) 28. Similarly, the Y computation block 12 includes operational blocks such as a register file 30, a multiplier 32, an ALU 34, a shifter 36 and a CLU 38. The DSP may include additional operational blocks, not shown in FIG. 1, such as a program sequencer, a data address generator, on-chip memory, a DMA controller and an external interface. All operational blocks may be fabricated on a single substrate to form an integrated circuit.

A typical chip layout is configured with different operational blocks located in different areas of the chip. As a result of the extremely small geometries of the transistors on the chip, transistors in different blocks may have different speeds and different leakage currents. In some cases, the variation in transistor speed and/or leakage current may result in the chip failing to meet specification for a particular application.

Figure 2:
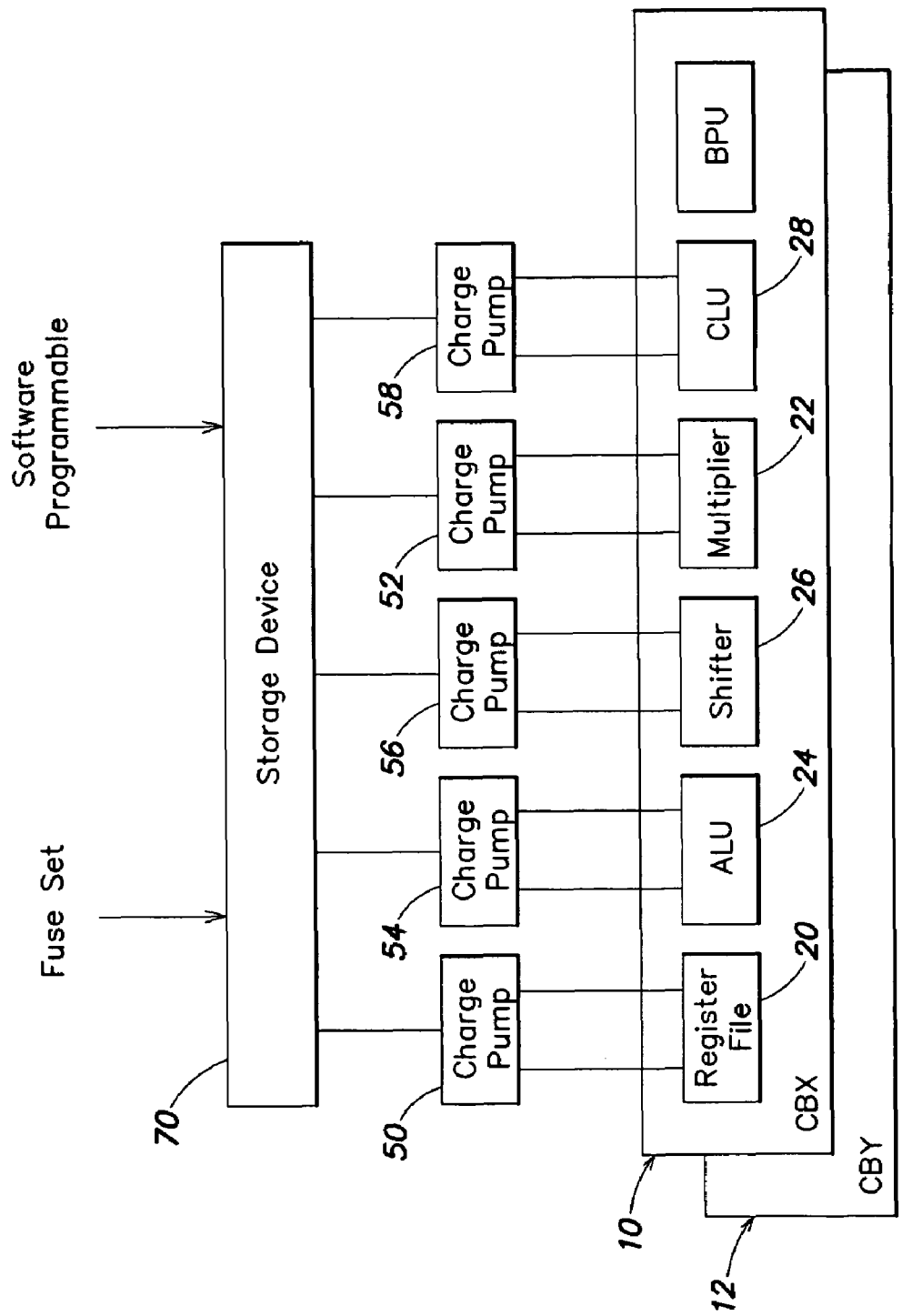
FIG. 2 is a schematic block diagram that illustrates a first embodiment of the invention.

A partial block diagram of an integrated circuit in accordance with an embodiment of the invention is shown in FIG. 2. A charge pump 50 supplies P-well and N-well biases to register file 20, a charge pump 52 supplies P-well and N-well biases to multiplier 22, a charge pump 54 supplies P-well and N-well biases to ALU 24, a charge pump 56 supplies P-well and N-well biases to shifter 26, and a charge pump 58 supplies P-well and N-well biases to CLU 28. As shown, a charge pump is associated with each operational block of the integrated circuit to permit individual control of well biases. A similar arrangement of charge pumps may supply well biases to the operational circuits of computation block 12.

A charge pump is a circuit that can generate voltages outside the range of its supply voltage. For the example of a positive supply voltage, the charge pump may generate a well bias above or below the supply voltage of the integrated circuit and a well bias above or below ground potential. Thus, the charge pump can supply a forward well bias or a reverse well bias to NMOS devices and PMOS devices. In some embodiments, each charge pump is located in the operational block for which the charge pump supplies well biases. In other embodiments, one or more of the charge pumps is located outside the operational block but on the same integrated circuit as the operational block.

The integrated circuit further includes a storage device 70 that stores bias settings for each of charge pumps 50, 52, 54, 56 and 58. Storage device 70 may be any storage device that is capable of holding bias settings, such as an arrangement of fuses or switches, a register or other memory device. Further, storage device 70 may be a global storage device that holds bias settings for the operational blocks of the integrated circuit. In other embodiments, each operational block or a group of operational blocks may have a storage device. In some embodiments, the bias settings may be one-time programmable (OTP) and may be set during the chip manufacturing process, such as by fuse programming or programming a read-only memory. In other embodiments, the bias settings may be software programmable, for example, to power down an operational block when it is not being utilized. In further embodiments, the charge pumps may be controlled by a combination of one-time programming and software programming. For example, the one-time programmable bias settings may be utilized as default values. When the bias settings are programmed by an application program, the programmable bias settings override the default bias settings.

By way of example only, the P-well bias settings may range from a few hundred millivolts less than the supply voltage to a few hundred millivolts greater than the supply voltage, and the N-well bias setting may range from a few hundred millivolts below ground potential to a few hundred millivolts above ground potential. The number of levels depends on the desired level of control. In one embodiment, a three-bit value is used for each bias setting, thus providing eight possible bias setting values.

Figure 3:
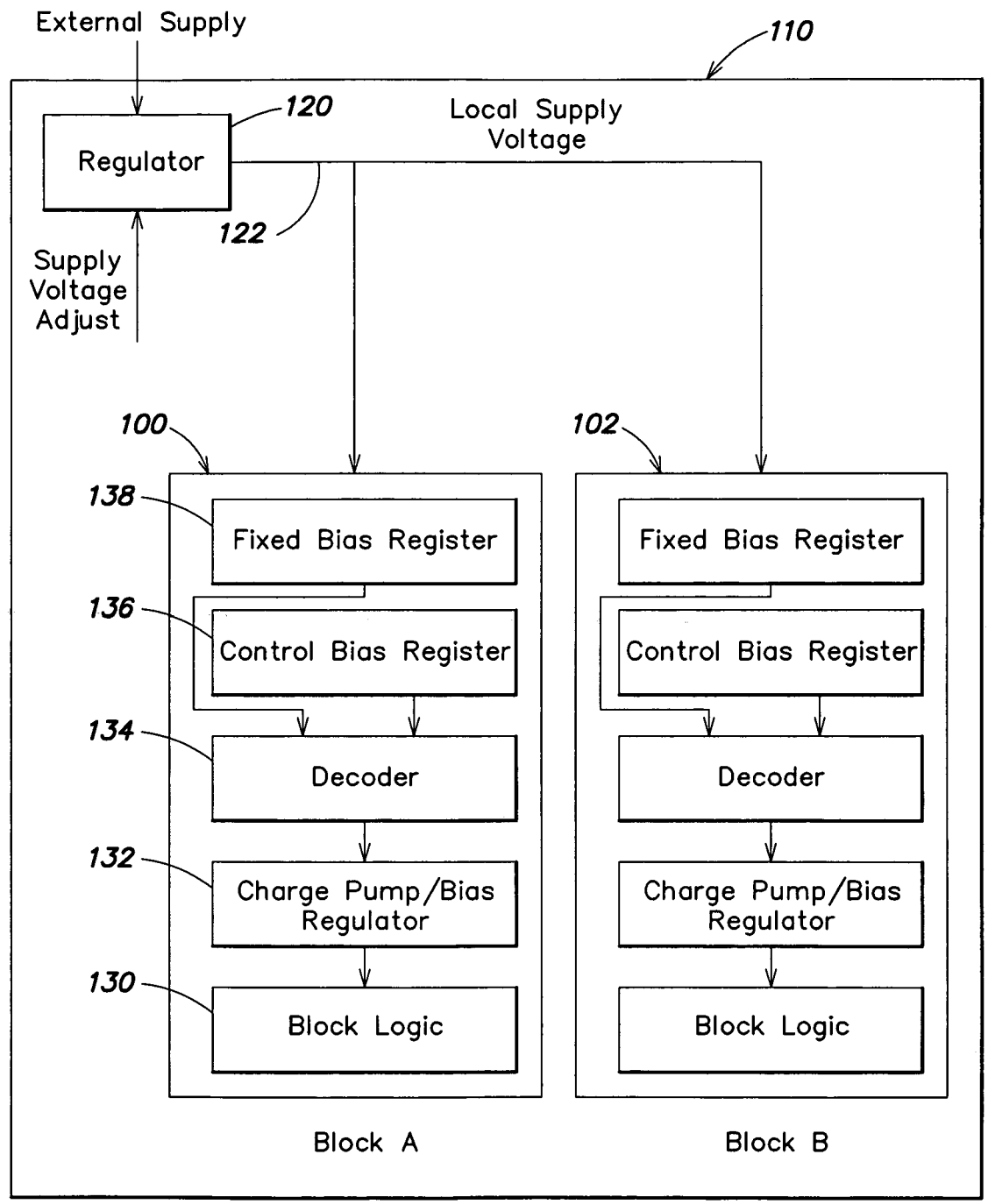
FIG. 3 a schematic block diagram that illustrates a second embodiment of the invention.

A partial block diagram of an integrated circuit in accordance with a second embodiment of the invention is shown in FIG. 3. A first operational block 100 and a second operational block 102 are formed on a substrate 110. It will be understood that the integrated circuit may include two or more operational blocks within the scope of the invention. An on-chip supply voltage regulator 120 permits adjustment of a local supply voltage 122 provided to operational blocks 100 and 102.

As shown, operational block 100 may include an operational circuit, or block logic 130, a charge pump 132, a decoder 134, a control bias register 136 and a fixed bias register 138. Operational block 102 may have the same configuration. However, it will be understood that the block logic in each operational block may be different. Fixed bias register 138 may supply a fixed bias setting to decoder 134, and control bias register 136 may provide a software-programmable bias setting to decoder 134. Fixed bias register 138 and control bias register 136 serve as local bias registers in each of operational blocks 100 and 102. Decoder 134 selects a bias setting and converts the digital value of the bias setting to an analog value that is supplied to charge pump 132. Charge pump 132 supplies P-well and N-well bias voltages to the transistors of block logic 130 based on the bias settings.

The configuration of FIG. 3 permits individual control of the P-well and N-well biases supplied to each operational block. The bias settings may be fixed at manufacturing, may be software-programmable or may be a combination of fixed bias settings and software-programmable bias settings. In some embodiments, the software-programmable bias settings override the fixed bias settings, which serve as default bias settings. In other embodiments, some bias settings are fixed and others are software-programmable. The supply voltage may be adjustable on a per-chip basis.

Figure 4:
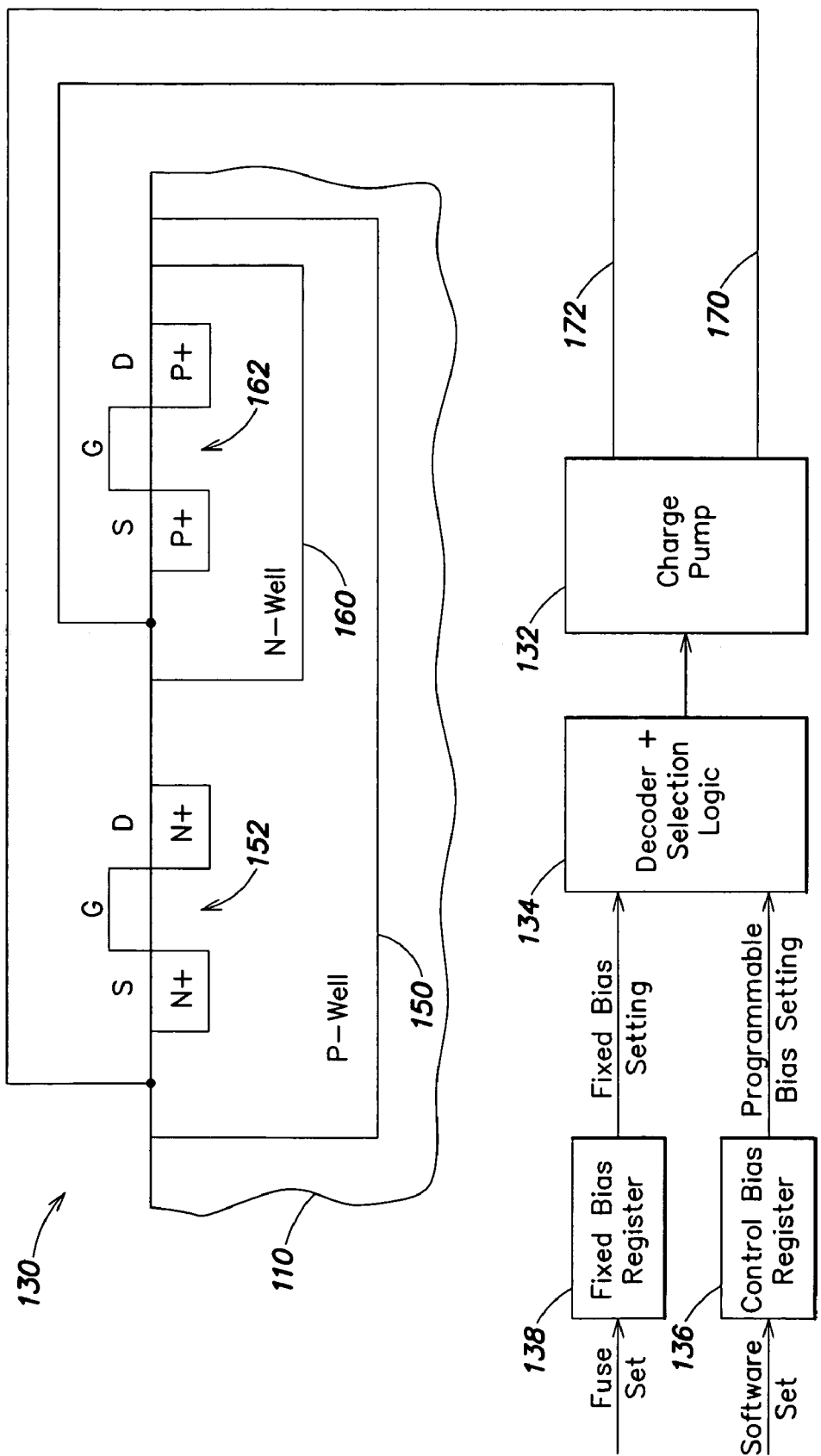
FIG. 4 is a schematic block diagram of an operational block in accordance with an embodiment of the invention.
Figure 5:
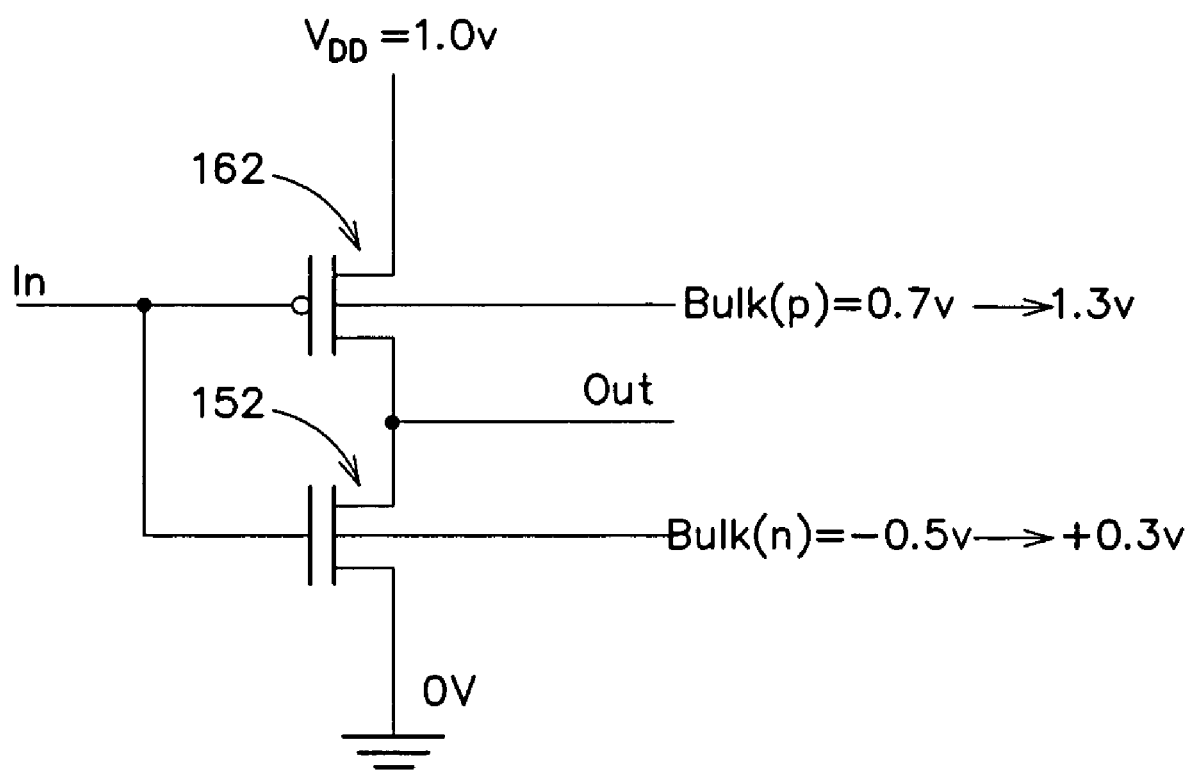
FIG. 5 is a schematic diagram of a simple CMOS circuit, illustrating well biasing.

FIG. 4 illustrates an example of a connection of well biases from charge pump 132 to the circuitry of block logic 130. As discussed above, block logic 130, charge pump 132, decoder 134, control bias register 136 and fixed bias register 138 are all formed in substrate 110. A highly simplified example of block logic 130 is shown in FIG. 4. A P-well 150 is formed in substrate 110, and an NMOS transistor 152 is formed in P-well 150. An N-well 160 is formed in P-well 150, and a PMOS transistor 162 is formed in N-well 160. As shown, charge pump 132 provides a well bias 170 to P-well 150 and a well bias 172 to N-well 160.

The following examples demonstrate that supply voltage regulation and well biasing are needed in a 130 nanometer technology.

EXAMPLE A

A chip with a power budget of PD and a frequency target of FMAX is characterized by 70 percent dynamic power and 30 percent static power. All of the transistors on the chip are running 30 percent fast, causing the frequency target to be exceeded by 30 percent. However, due to the fast transistors, the leakage is increased by 400 percent, causing the power budget to be exceeded by 40 percent. The dynamic power does not change with process, but only the static power does. If the operating voltage is decreased by 30 percent, the chip is still within the frequency target, since frequency tracks roughly linearly with operating voltage. However, the total power of the device is reduced to acceptable yield limits. If biasing was used, the power window would be missed, since back biasing has only a limited effect on leakage and only affects the static current. It has also been shown that at 90 nanometers and below, reverse biasing has limited effect on reducing leakage.

EXAMPLE B

A chip with a power budget PD and a frequency target FMAX is characterized by 90 percent dynamic power and 10 percent static power. All the transistors on the chip are running slightly faster than typical, except one small operational block that is running 10 percent slow. The static power of the slow block is only marginally affected by the 10 percent slow down and does not contribute a large portion of the chip's total power. Increasing the voltage to speed up the small block along with all the other transistors would cause the chip to exceed its power budget. The new power with 10 percent higher supply voltage would be 1.2, which would be 20 percent higher than acceptable. If instead, the supply voltage is decreased slightly and the slow block is forward biased, the small block can be sped up slightly, while not affecting the power of the rest of the blocks. If needed, the total supply voltage can be reduced by a small amount to compensate for the increased leakage of the slow block, which now has an increased static current.

The determination whether a chip belongs to example A or example B, or one of many other variations, is made at test time. Each operational block is tested to determine the maximum operating frequency. This determination can be made either through functional tests or through at speed scan-based testing. Once the speed of each block has been determined, a determination can be made whether it is more efficient to forward bias certain blocks, reverse bias certain blocks or to adjust the chip level voltage supply.

In deep submicron designs, a significant yield increase can be obtained by combining the technique of chip level voltage regulation and block level bias voltage adjustment.

Testing Method

As discussed above, the speed of digital logic varies greatly between chips and even within the same chip. The slowest die and the fastest die can vary by as much as 70 percent in operating frequency. Even transistors within the same chip behave differently, varying by as much as 25 percent in some processes.

The power consumed by a chip is the sum of dynamic power and leakage power. Well biasing affects only leakage power, whereas supply voltage affects both leakage power and dynamic power.

Figure 6:
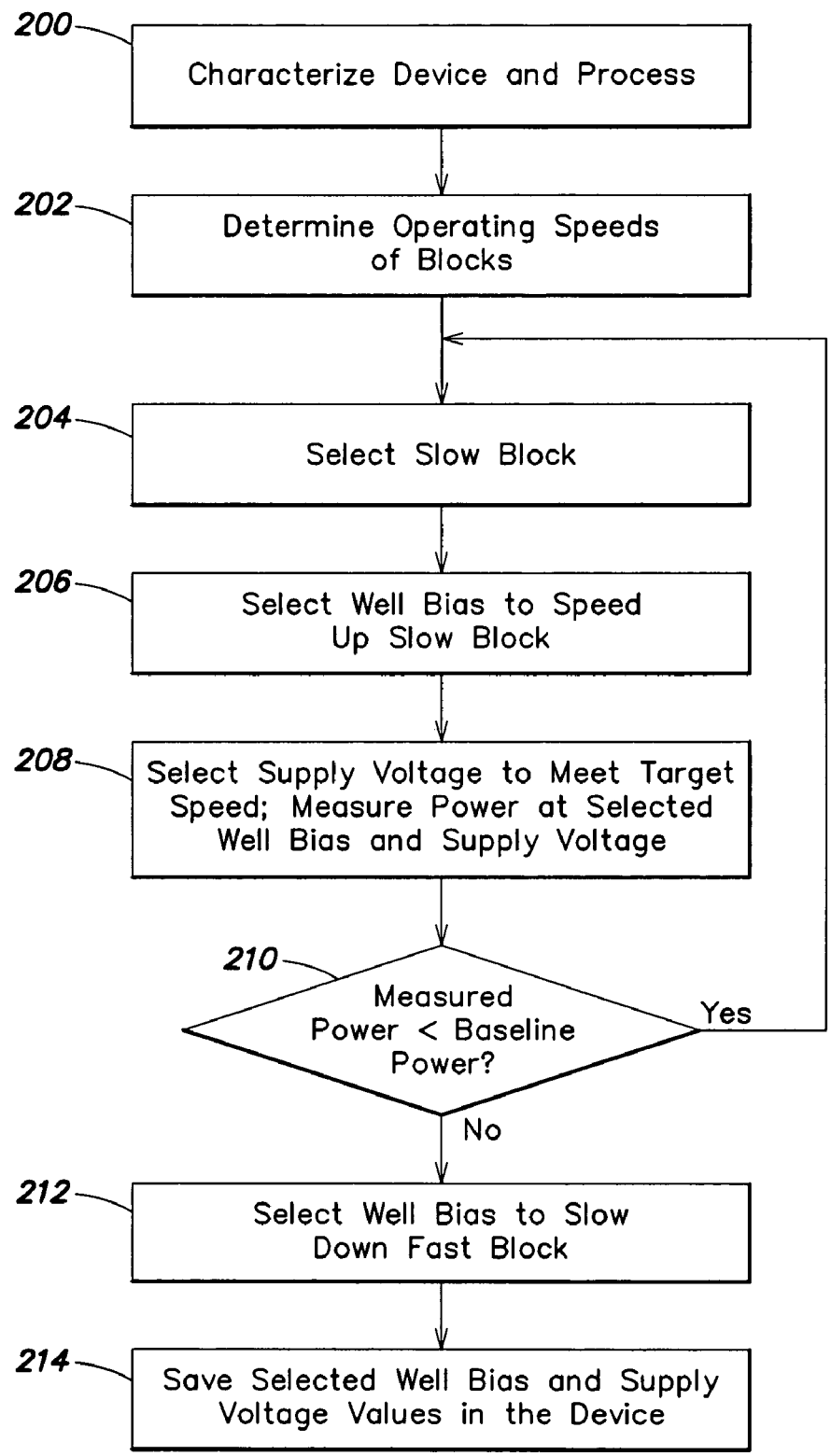
FIG. 6 is a flow chart of a-test method according to an embodiment of the invention.

The following testing method addresses the need for each of the devices manufactured to meet a specific frequency target. The goal of the testing method is to make all chips and all blocks within the same chip have the same operating frequency, thus maximizing yield and performance. A flow chart of a testing method in accordance with an embodiment of the invention is shown in FIG. 6.

In act 200, the process and the integrated circuit design in question are characterized to determine the relationship between voltage and speed and between well bias and speed. Research has shown that speed varies fairly linearly with supply voltage, when operating near the nominal supply voltage of the process. A 10 percent drop in supply voltage causes a 10 percent drop in operating frequency. In well biasing, the relationship is less obvious and must be carefully characterized for the process and integrated circuit device in question. The relationships between voltage and speed and between well bias and speed are used later to facilitate the testing procedure when choosing the optimal supply voltage and well bias. The one-time characterization process avoids the time-consuming task of trying different combinations of supply voltage and well bias during the testing of each individual device. The characterization is performed only once per process and device type and does not affect the test cost of each device.

The following steps are performed on each integrated circuit device. In act 202, each device is checked to determine its maximum operating speed at the minimum supply voltage. The well bias is set to zero during measurement of the maximum operating speed in act 202. The testing is done a per block basis, by using scan-based speed path testing, BIST (Built-in System Test) or by developing speed specific tests for the device. A report may be generated that shows the maximum operating speed of each block at the minimum supply voltage. The blocks are sorted by speed.

In act 204, a slow operational block, typically the slowest operational block, is selected. The selected block is slower than at least one other operational block.

In act 206, a forward well bias is selected to speed up the selected block to the next slowest block, thus equalizing the speed of the slowest and next slowest blocks. The forward well bias value to equalize the speeds of the two slowest blocks is derived from the process characterization and can be selected from a lookup table. The lookup table may contain values of well bias that correspond to different operating speeds and different values of supply voltage.

In act 208, the supply voltage to ensure that all blocks meet the target operating speed is selected. Since the slowest operational block determines the speed of the system, the supply voltage is selected by using a lookup table derived from the process characterization. The lookup table may contain values of supply voltage that correspond to different operating speeds and different well bias values. Then, the power of the integrated circuit device is measured with the selected well bias and the selected supply voltage applied to the device.

In act 210, the measured power is compared with a baseline power that meets the target operating frequency with no well bias applied to the operational blocks. If the measured power is less than the baseline power, the process returns to act 204, and another slow block is selected for speed up.

When the measured power is not less than the baseline power, a reverse well bias is selected in act 212 to slow down an operational block that is faster than at least one other operational block. The fastest blocks are reverse biased one at a time and are checked for correct operation at the target frequency. A power measurement is not required in act 212. The reverse well bias values are selected from a lookup table derived from the process characterization. The lookup table may contain values of reverse well bias that correspond to different operating speeds and different supply voltages.

In act 214, the selected well bias and supply voltage values are saved in a non-volatile memory on the device being tested. The non-volatile memory can be electrical fuses, flash memory or any other storage device capable of saving the values. The number of bits needed to store the values depends on the resolution of the power supply regulator and the well bias regulator. In some embodiments, five to six bits are utilized for the well bias of each operational block and five to six bits are used for the global supply voltage. Each device may be tested with the saved well bias and supply voltage values before being shipped to a customer.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for testing an integrated circuit, the integrated circuit including two or more operational blocks fabricated in a substrate, comprising:
   (a) determining a maximum operating speed of each of the operational blocks at a minimum supply voltage and no well bias;
   (b) selecting an operational block that has a slower operating speed than at least one other operational block;
   (c) selecting a well bias to speed up the selected operational block;
   (d) selecting a supply voltage to meet a target operating frequency at the selected well bias and measuring power with the selected well bias applied to the selected operational block and the selected supply voltage applied to the integrated circuit;
   (e) repeating acts (b)-(d) while the measured power is less than a baseline power that meets the target operating frequency with no well bias applied to the operational blocks; and
   (f) saving the selected well bias and supply voltage settings for operation of the integrated circuit.

2. A method as defined in claim 1, wherein determining a maximum operating speed of each of the operational blocks comprises adjusting a frequency of a clock applied to the integrated circuit and monitoring operation of the integrated circuit.

3. A method as defined in claim 1, further comprising characterizing the integrated circuit and a process for fabrication thereof to determine speed as a function of supply voltage and speed as a function of well bias.

4. A method as defined in claim 3, wherein the selected well bias is obtained from a lookup table based on the characterization of the integrated circuit and fabrication process.

5. A method as defined in claim 3, wherein the selected supply voltage is obtained from a lookup table based on the characterization of the integrated circuit and fabrication process.

6. A method as defined in claim 1, wherein selecting a well bias comprises selecting a forward well bias to equalize the speeds of a slowest operational block and a second slowest operational block.

7. A method as defined in claim 1, further comprising selecting a reverse well bias to slow down an operational block that has a faster operating speed than at least one other operational block.

8. A method as defined in claim 7, wherein the reverse well bias to slow down the faster operational block is obtained from a lookup table based on the characterization of the integrated circuit and fabrication process.

9. A method as defined in claim 1, further comprising measuring the baseline power that meets the target operating frequency with no well bias.

10. A method as defined in claim 1, wherein saving the selected well bias and supply voltage settings comprises writing the selected settings to a non-volatile memory in the integrated circuit.

* * * * *